US005659204A

United States Patent [19]

Miller et al.

[11] Patent Number: 5,659,204
[45] Date of Patent: Aug. 19, 1997

[54] APPARATUS FOR AND A METHOD OF GENERATING AN ANALOG SIGNAL FOR CONTROL OF DYNAMIC BRAKING

[75] Inventors: Craig A. Miller; Paul J. Kettle, Jr.; Vincent Ferri, all of Pittsburgh, Pa.

[73] Assignee: Westinghouse Air Brake Company, Wilmerding, Pa.

[21] Appl. No.: 340,742

[22] Filed: Nov. 16, 1994

[51] Int. Cl.$^6$ .................. B60L 7/00; H02P 3/14
[52] U.S. Cl. .......................... 290/9; 318/375
[58] Field of Search .............. 364/426.05; 290/9; 318/375

[56] References Cited

U.S. PATENT DOCUMENTS

| | | | |
|---|---|---|---|
| 3,715,579 | 2/1973 | Eblovi | 246/187 A |
| 3,794,834 | 2/1974 | Auer, Jr. et al. | 246/187 B |
| 3,805,056 | 4/1974 | Birkin | 246/187 B |
| 4,468,631 | 8/1984 | Goldberg | 330/284 |
| 4,671,576 | 6/1987 | Fourie | 303/3 |
| 4,735,385 | 4/1988 | Nickles et al. | 246/182 B |
| 5,016,840 | 5/1991 | Bezos | 246/187 R |
| 5,172,316 | 12/1992 | Root et al. | 364/426.01 |
| 5,537,014 | 7/1996 | Kettle, Jr. et al. | 318/375 |
| 5,537,285 | 7/1996 | Jenets et al. | 361/100 |

*Primary Examiner*—Steven L. Stephan
*Assistant Examiner*—Christopher Cuneo
*Attorney, Agent, or Firm*—James Ray & Associates

[57] ABSTRACT

A locomotive throttle controller having a central processor unit which generates an analog signal for control of dynamic braking and includes an analog output driver which supplies the dynamic brake reference voltage. Such analog output driver includes a device for receiving an analog signal from the central processor unit and for converting such analog signal into an analog voltage signal. The analog output driver provides an arrangement for using such analog voltage signal to provide a regulated voltage output to a trainline which controls the dynamic braking. Incorporated into the output driver is a protection arrangement to protect it from reverse voltages on such trainline and an arrangement for protecting such output driver from excess current demand of the trainline.

29 Claims, 1 Drawing Sheet

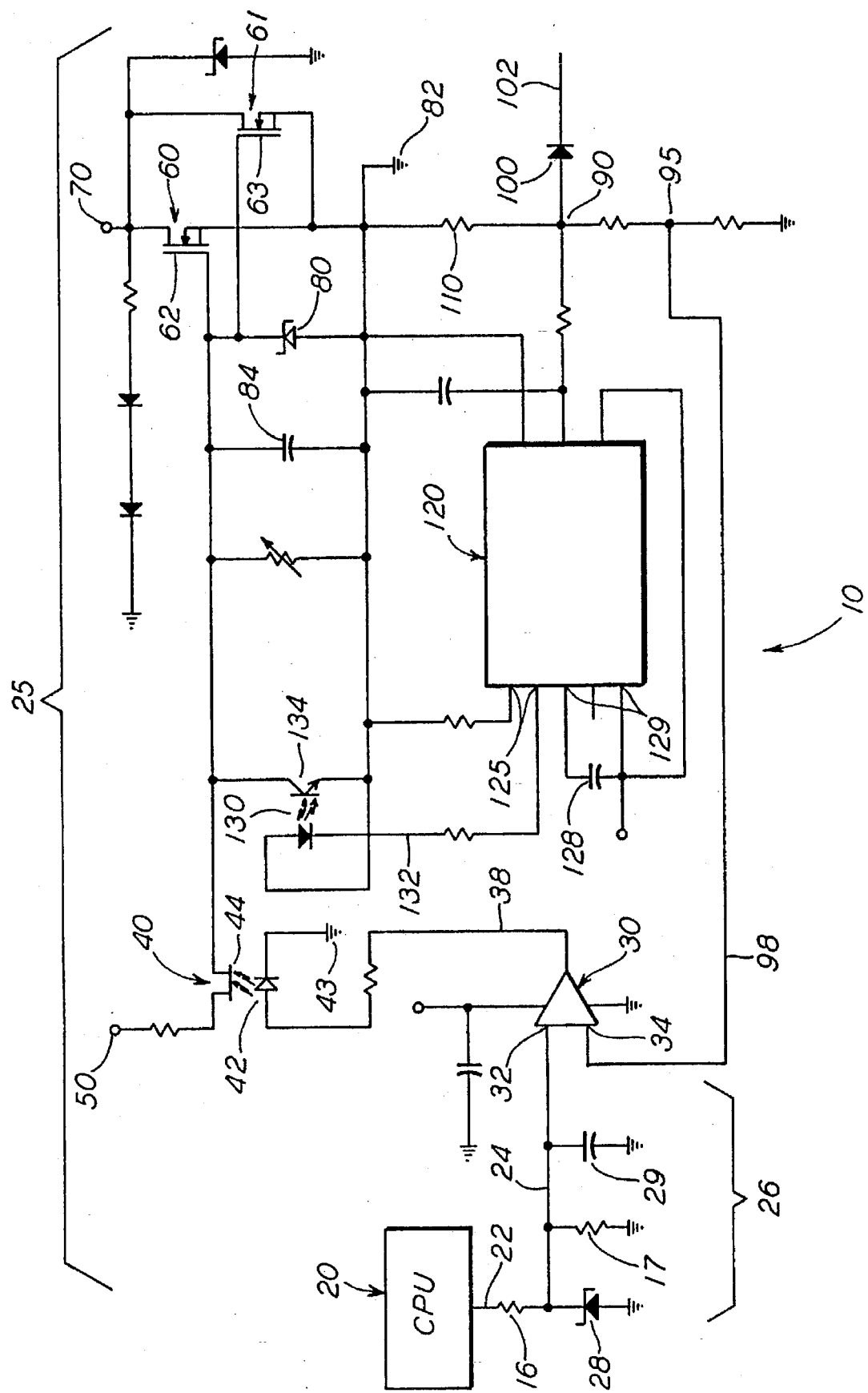

5,659,204

APPARATUS FOR AND A METHOD OF GENERATING AN ANALOG SIGNAL FOR CONTROL OF DYNAMIC BRAKING

CROSS REFERENCE TO RELATED APPLICATION

The invention taught in this patent application is closely related to the invention taught in the following co-pending patent application: AN APPARATUS FOR FEEDBACK OF AN ANALOG SIGNAL USED TO MONITOR AND/OR CONTROL DYNAMIC BRAKING AND METHOD OF OPERATING U.S. Pat. No. 5,537,014. The above referenced patent was filed concurrently with the present application, and has been assigned to the assignee of the present invention. The referenced application operates as a reciprocal to the present application in a railroad throttle control system. The present application receives a signal for control of dynamic braking from the central processor unit of a locomotive throttle controller, and places an analog voltage signal on a trainline which controls dynamic braking. The referenced application senses the analog voltage applied to the trainline, and sends a feedback signal representing that voltage back to the central processor.

Each of the above-referenced patent applications are being filed concurrently herewith and are assigned to the assignee of this invention.

Additionally, the teachings of each of these patent applications is incorporated herein by reference thereto.

FIELD OF THE INVENTION

The present invention relates, in general, to locomotive mounted throttle controllers and, more particularly, this invention relates to an apparatus for and a method of generating an analog signal for control of the dynamic brake portion of an electronically controlled throttle controller mounted on a railway locomotive.

BACKGROUND OF THE INVENTION

A person skilled in the art will recognize that in a lead locomotive, the throttle controller assembly receives signals from the central processor unit for control of locomotive engine, dynamic braking, and other locomotive functions. Based on the signals received from the central processor unit, the throttle controller assembly applies signals to the trainline, which is a multi strand electrical cable. The trainline conveys these signals to the functions being controlled. For example, the dynamic brake system is controlled by an analog voltage signal applied to one of the strands which is referred to in the art as the "24T trainline". For a consist of locomotives which are coupled together, the trainline cable is connected between locomotives. The controlled locomotives are controlled by signals on the trainline generated by the throttle controller of the lead locomotive, based on signals from the central processor unit of the lead locomotive.

It is quite well known in the railway industry, prior to the present invention, that the throttle controller assemblies used in a railway type locomotive are almost exclusively of the mechanical type. Mechanical type throttle controller assemblies of the prior art have normally utilized a number of mechanical devices in order to achieve actuation of the necessary microswitches and/or contacts. It is equally well known, for example, that cams are used extensively in this application in order to achieve the required actuation of the various microswitches and/or contacts disposed in the mechanical type throttle controller.

Such mechanical type throttle controllers which are presently being used on railway locomotives exhibit a number of relatively serious drawbacks and/or other limitations. These limitations have become more pronounced as the length of freight trains has grown in modern railroading, because the use of more and more locomotives are now required in a train consist in order to pull and/or push the added loads being hauled. For example, these mechanical type throttle controllers utilize either microswitches or contacts to control the voltage that is being applied to the trainline. Furthermore, there is no provision in these prior art mechanical throttle controllers for possible shut down of the system in the event of an output over current.

Additionally, these mechanical type throttle controllers are not equipped to provide the operator of the locomotive with any important feedback information and, consequently, they may not recognize a potential failure situation. Throttle controllers of the mechanical type also utilize either a resistive type voltage divider or a high power potentiometer in order to control the voltage and they are not equipped for shutdown of voltage regulation.

The prior art mechanical throttle controllers normally provide labels over each of the mechanical handles to convey only the position of the handle to the locomotive operator. However, these mechanical type throttle controllers are not equipped to display certain other relevant information, such as various diagnostic information, status information and/or warning type messages.

Furthermore, in a situation where it is either desirable or necessary to provide the required throttle control from a remote host over the communication lines, the currently used mechanical type throttle controllers require that a number of additional relays be used.

It can be seen from the above discussion of the prior art mechanical type throttle controller assemblies, presently used in the railroad industry, that there is an unfilled need which exists in the modern railroad industry for an improved railway locomotive type throttle controller assembly which will provide enhanced performance capability, additional functions which are not possible to accomplish with the prior art mechanical type throttle controllers and more consistent reliability. It is evident that this need has been addressed by each of the present invention and the closely related additional inventions which are being filed concurrently herewith.

SUMMARY OF THE INVENTION

In a first aspect, the present invention provides in a locomotive throttle controller having a central processor unit which generates a signal for control of dynamic braking, a method for utilizing said signal and for supplying the dynamic brake reference voltage to a trainline. Such method includes the steps of receiving the signal for control of dynamic braking and then converting it into a first comparison voltage signal having a range of values suitable to he used as an input to an operational amplifier. The first comparison voltage signal is applied to a first input of an operational amplifier. Sampling the voltage being sent to such trainline at a trainline output node and dividing it down into the range of the first comparison voltage signal to establish a second comparison voltage signal. This second comparison voltage signal is applied to a second input of such operational amplifier. Using the output of such operational amplifier as an error signal to adjust the resistance of at least one pass element in a conduction path between a high voltage supply and such trainline output node.

Additionally, attaching the anode of a semiconductor diode to the trainline output node and attaching the cathode of such diode to the trainline.

In a second and more preferred aspect, the present invention provides in a locomotive throttle controller having a central processor unit which generates a signal for control of dynamic braking, a method for utilizing said signal and for supplying the dynamic brake reference voltage to a trainline which includes the steps of first receiving the signal for control of dynamic braking and then converting it into a first comparison voltage signal having a range of values suitable to be used as input to an operational amplifier. Applying such first comparison voltage signal to a first input of an operational amplifier. Sampling the voltage being sent to such trainline at a trainline output node and dividing it down into the range of the first comparison voltage signal to establish a second comparison voltage signal. Then, applying this second comparison voltage signal to a second input of such operational amplifier. The output of such operational amplifier is then used to control the voltage of a pass element control node. Such pass element control node is attached to the control side of at least one pass element disposed in a conduction path disposed between a high voltage source and such trainline. A current-sensing resistor is positioned in such conduction path. The two voltages at the ends of said current-sensing resistor are sampled and then applied as inputs to an integrated circuit. In the integrated circuit the difference between the two said voltages is compared with a reference voltage, and, in the event that the voltage difference exceeds such reference voltage a nonzero output voltage signal is provided on an output status connector. A conduction path from such output status connector is provided through the photodiode side of an optical isolator to ground and there is provided a conduction path from such pass element control node through the photoconductor side of the optical isolator to ground so that in the event that an excessive current passes through such current-sensing resistor, the pass element control node will be grounded so current to the trainline will be turned off.

In a third aspect of the present invention there is provided in a locomotive throttle controller having a central processor which generates an analog signal for control of dynamic braking an analog output driver which supplies the dynamic brake reference voltage. This analog output driver includes a first means connected for receiving an analog signal from such central processor. Such first means converts the analog signal into an analog voltage signal. Means are provided to receive such analog voltage signal for using this analog voltage signal to provide a regulated voltage output to a trainline which controls the dynamic braking on a locomotive. There is a third means connected to such analog output driver for protecting the driver from reverse voltages on the trainline. The final essential component in this analog output driver is a fourth means connected thereto for protecting such driver from excess current demand of the trainline.

OBJECTS OF THE INVENTION

It is, therefore, one of the primary objects of the present invention to provide an apparatus for and a method of generating an analog signal for control of dynamic braking as a part of an electronically controlled locomotive mounted throttle controller which will significantly enhance the reliability of such throttle controller.

Another object of the present invention is to provide an apparatus for and a method of generating an analog signal for control of dynamic braking as a part of an electronically controlled locomotive mounted throttle controller which enhance the performance of such throttle controller.

Still another object of the present invention is to provide an apparatus for and a method of generating an analog signal for control of dynamic braking as a part of an electronically controlled locomotive mounted throttle controller which is rather easy to implement.

Yet another object of the present invention is to provide an apparatus for generating an analog signal for control of dynamic braking as a part of an electronically controlled locomotive mounted throttle controller which may have incorporated therein a means for blocking an extremely high reverse voltages.

A further object of the present invention is to provide an apparatus for generating an analog signal for control of dynamic braking as a part of an electronically controlled locomotive mounted throttle controller which may have incorporated therein a means for protecting against relatively high-voltage spikes.

An additional object of the present invention is to provide an apparatus for generating an analog signal for control of dynamic braking as a part of an electronically controlled locomotive mounted throttle controller which may have incorporated therein a means for reducing transients.

Still yet another object of the present invention is to provide an apparatus for generating an analog signal for control of dynamic braking as a part of an electronically controlled locomotive mounted throttle controller which may have incorporated therein a means for reducing spikes.

In addition to the various objects and advantages of the present invention which have been discussed above it should be noted that various other objects and advantages of the apparatus for and method of generating an analog signal for control of dynamic braking in a system forming a part of an electronically controlled locomotive mounted throttle controller will become more readily apparent to those persons skilled in the art from the following more detailed description of the invention, particularly when such description is taken in conjunction with the attached drawing Figure and with the appended claims.

BRIEF DESCRIPTION OF THE DRAWING

FIG. 1 is a circuit diagram of a presently preferred arrangement to provide an analog signal to be used to control the dynamic brake portion of an electronically controlled locomotive mounted throttle controller.

BRIEF DESCRIPTION OF A PRESENTLY PREFERRED AND VARIOUS ALTERNATIVE EMBODIMENTS OF THE INVENTION

In an electronically controlled railway locomotive throttle controller having a central processor which generates a signal for control of dynamic braking the present invention provides a method for utilizing such signal generated for supplying the dynamic brake reference voltage to a trainline.

Such method includes the steps of receiving the signal generated for control of dynamic braking and converting it into a first comparison voltage signal having a range of values suitable to be used as input to an operational amplifier. Next, applying this first comparison voltage signal to a first input of an operational amplifier. Thereafter, sampling the voltage being sent to such trainline at a trainline output node and dividing it down into the range of such first comparison voltage signal. This will establish a second comparison voltage signal. Such second comparison voltage signal is applied to a second input of the operational amplifier.

The output of said operational amplifier is then used as an error signal to adjust the resistance of at least one pass element in a conduction path disposed between a high voltage supply and the trainline output node.

Preferably, in this step, the error signal obtained from a current sensing resistor in the path from the high voltage supply and the trainline output node is passed through the photodiode side of an optical isolator and the photoconductor side of such optical isolator is used to admit current from a supply voltage to a pass element driving node. In addition, providing a resistive path from such pass element driving node to a ground and connecting such pass element driving node to the input of such at least one pass element. This step also preferably includes the step of reducing transients by integrating the voltage of the pass element driving node by a capacitor connecting such node to a ground and the step of clipping voltage spikes on such pass element driving node by a diode connected to the pass element driving node and a ground. The diode being a type which normally does not conduct, but conducts when the voltage across it exceeds a known value. Further, this step includes the further step of inserting a current-sensing resistor in said conduction path.

In the presently preferred embodiment of the invention, such signal generated for control of dynamic braking will be a voltage signal will be attached through a plurality of resistors to a ground and such first comparison voltage signal will be obtained from a node connected to at least two of said resistors.

The method, in this preferred embodiment, further includes the step of clipping high voltage spikes from such first comparison voltage signal by grounding through a diode which normally does not conduct, but conducts when the voltage across it exceeds a known value.

Additionally, the method further includes the step of integrating such first comparison voltage signal in time by applying it to one terminal of a capacitor having another terminal connected to a ground.

In a locomotive throttle controller having a central processor which generates a signal for control of dynamic braking the present invention provides an alternative method for utilizing such signal and for supplying the dynamic brake reference voltage to a trainline.

The alternative method comprising the steps of receiving the signal generated for control of dynamic braking and converts it into a first comparison voltage signal having a range of values suitable to be used as input to an operational amplifier. Next, applying this first comparison voltage signal to a first input of an operational amplifier. Thereafter, sampling the voltage being sent to such trainline at a trainline output node and dividing it down into the range of such first comparison voltage signal. This will establish a second comparison voltage signal. Such second comparison voltage signal is applied to a second input of the operational amplifier.

The output of said operational amplifier is then used to control the voltage of a pass element control node. The pass element control node is attached to the control side of at least one pass element disposed in a conduction path between a high voltage source and said trainline and a current-sensing resistor is placed in such conduction path.

The two voltages at the ends of said current-sensing resistor are sampled and then applied these as inputs to an integrated circuit. In such integrated circuit, the difference between the two voltages is compared with a reference voltage, and, in the event that such voltage difference exceeds the reference voltage, a nonzero output voltage signal is provided on an output status connector.

A conduction path is provided from such output status connector through the photodiode side of an optical isolator to ground and another conduction path is provided from such pass element control node through the photoconductor side of such optical isolator to ground so that in the event that an excessive current passes through such current-sensing resistor the pass element control node will be grounded so current to the trainline will be turned off.

In a more preferred embodiment of the present invention, the method includes the further steps of starting a timer in the event that the current to such trainline is turned off, waiting a predetermined time, and re-applying voltage to such pass element control node to re-energize the trainline.

The present invention further provides, in an electronically controlled railway locomotive throttle controller assembly, generally designated 10, having a central processor unit, generally designated 20, which generates an analog signal 22 for control of dynamic braking, an analog output driver 25 which supplies the dynamic brake reference voltage.

This analog output driver includes a first means 26 connected for receiving an analog signal 22 from such central processor 20 and for converting said analog signal 22 into an analog voltage signal 24. First means 26 includes resistors 16 and 17 in series to generate analog voltage signal 24 from analog signal 22.

There is a pass element generally designated as 60, optionally with a parallel pass element 61, responsive to the analog voltage signal 24 for using the analog voltage signal 24 to control a voltage output at node 90 to a trainline 102 which controls dynamic braking.

Additionally, such analog output driver 25 includes a second means 100 connected to such analog output driver 25 for protecting such analog output driver 25 from reverse voltages on such trainline and a fourth means, which includes current sensing resistor 110, integrated circuit 120 and an optical isolator generally designated as 130, connected to such analog output driver 25 for protecting it from excess current demand of such trainline.

In the preferred embodiment such first means 26 cooperates with a means 28 for removing high-voltage spikes from the analog voltage signal 24. Preferably, means 28 is a diode which normally does not conduct, but which conducts when the voltage across it exceeds a known value. The diode being connected between a node to which such analog voltage signal 24 is applied, and to a ground.

It is likewise preferred that the first means 26 of the analog output driver 25 will cooperates with a means 29 for integrating such analog voltage signal 24 in time to reduce transients. Such means 29 is preferably a capacitor connected to a node to which such analog voltage signal 24 is applied and to a ground.

Pass element 60 cooperates with an operational amplifier 30 to compare the analog voltage signal 24 at terminal 32 with a feedback voltage signal 98 obtained from voltage divider node 95, which is proportional to the voltage on node 90. Operational amplifier 30 provides output 38 to the photoemitter side 42 of an optical isolator, generally designated as 40, and thence to ground 43. Optical isolator 40 has a photoconductor side 44. Photoconductor side 44 passes current from high voltage source 50 to pass element control node 62 to control the impedance of pass element 60. Optionally, a second pass element 61 in parallel with pass element 60, controlled by pass element control node 63 may be employed. The pass elements 60 and 61 have impedances controlled by the voltage on the pass element control nodes 62 and 63, respectively. These pass elements are connected to high voltage source 70 and control the current which flows through current sensing resistor 110 to node 90 which controls the voltage applied to trainline 102.

The analog output driver 25, in the presently preferred embodiment, further includes a means for clipping high-voltage spikes from such pass element control node 62. The preferred means for clipping such high-voltage spikes is a diode 80 which normally does not conduct, but conducts when the voltage across it exceeds a known value. Such diode 80 is connected to such pass element control node 62 and to ground 84.

There is a means 84 for reducing transients by integrating in time the voltage on such pass element control node. Preferably, the means 84 is a capacitor which connects the pass element control node 62 to a ground.

In a preferred embodiment of this invention, pass elements 60 and optionally pass element 61 are field effect transistors.

The analog output driver 25, in accordance with the presently preferred embodiment of the invention, further includes a current-sensing resistor 110 disposed in such conduction path and an integrated circuit 120 having two inputs connected to the two ends of such current-sensing resistor 110. The integrated circuit 120 being characterized as providing an output signal on an output status connector 125 in the event that the voltage drop across the current-sensing resistor 110 exceeds a predetermined value. There is an optical isolator 130 having its photodiode section 132 connected to said output status connector 125 and to ground 82. The photoconductor section 134 of such optical isolator 130 being connected to the pass element control nodes 62 and 63 and to a ground so that when the voltage drop across such current-sensing resistor 110 exceeds such predetermined value a nonzero voltage value for the output signal causes a current to flow through such photodiode section of the optical isolator 130, so that such pass element driving nodes 62 and 63 are connected to ground, thereby shutting off the current through pass elements 60 and 61, and thus shutting off the current to such trainline 102.

It is also preferred that the analog output driver 25 will further include a timer such as a capacitor 128 connected to input terminals 129 of such integrated circuit. The timer is activated in the event of an output overcurrent on trainline 95, in which case it delays the voltage rise of pass element control nodes 62 and 63, thereby delaying the passage of current through current sensing resistor 110. Hence, after the output overcurrent is over, it delays the application of voltage to node 90 and hence trainline 102. Current is supplied to such trainline 102 through a diode 100 which is characterized as providing protection from very high reverse voltages.

While a presently preferred and a number of alternative embodiments of the present invention have been described in detail above with reference to the drawing, it should be understood that various other adaptations and modifications to the apparatus for and a method of generating an analog signal for control of dynamic braking can be made by those persons who are skilled in the railway electronics art without departing from the spirit or scope of the appended claims.

We claim:

1. In a locomotive throttle controller having a central processor which generates a signal for control of dynamic braking, a method for utilizing said signal and for supplying the dynamic brake reference voltage to a trainline, said method comprising the following steps:

(a) receiving said signal for control of dynamic braking, and converting it into a first comparison voltage signal having a range of values suitable to be used as input to an operational amplifier;
    (b) applying said first comparison voltage signal to a first input of an operational amplifier;
    (c) sampling the voltage being sent to said trainline at a trainline output node, and dividing it down into the range of said first comparison voltage signal, to establish a second comparison voltage signal;
    (d) applying said second comparison voltage signal to a second input of said operational amplifier;
    (e) using the output of said operational amplifier as an error signal to adjust the resistance of at least one pass element in a conduction path between a high voltage supply and said trainline output node of step (c); and
    (f) attaching the anode of a semiconductor diode to said trainline output node; and attaching the cathode of said diode to said trainline.

2. The method, according to claim 1, wherein said signal for control of dynamic braking is a voltage signal.

3. The method, according to claim 1, wherein said signal for control of dynamic braking is a voltage signal and step (a) further comprising the step of attaching said voltage signal through a plurality of resistors to a ground and obtaining said first comparison voltage signal from a node connected to at least two of said resistors.

4. The method, according to claim 3, further comprising the step of clipping high voltage spikes from said first comparison voltage signal.

5. The method, according to claim 4, wherein said step of clipping high voltage spikes comprises grounding through a diode which normally does not conduct, but conducts when the voltage across it exceeds a known value.

6. The method, according to claim 1, wherein step (a) further comprises the step of integrating said first comparison voltage signal in time by applying it to one terminal of a capacitor having another terminal connected to a ground.

7. The method, according to claim 1, wherein step (e) is further characterized as comprising the steps of:

(a) passing said error signal through the photodiode side of an optical isolator;
    (b) using the photoconductor side of said optical isolator to admit current from a supply voltage to a pass element driving node;
    (c) providing a resistive path from said pass element driving node to a ground;
    (d) connecting said pass element driving node to the input of said at least one pass element.

8. The method, according to claim 7, further comprising the step of reducing transients by integrating the voltage of said pass element driving node by a capacitor connecting said node to a ground.

9. The method, according to claim 7, further comprising the step of clipping voltage spikes on said pass element driving node by a diode, connected to said pass element driving node and a ground, said diode being a type which normally does not conduct, but conducts when the voltage across it exceeds a known value.

10. The method, according to claim 1, wherein step (e) further comprises the step of inserting a current-sensing resistor in said conduction path.

11. In a locomotive throttle controller having a central processor which generates a signal for control of dynamic braking, a method for utilizing said signal and for supplying the dynamic brake reference voltage to a trainline, said method comprising the following steps:

(a) receiving said signal for control of dynamic braking, and converting it into a first comparison voltage signal having a range of values suitable to be used as input to an operational amplifier;

(b) applying said first comparison voltage signal to a first input of an operational amplifier;

(c) sampling the voltage being sent to said trainline at a trainline output node, and dividing it down into the range of said first comparison voltage signal, to establish a second comparison voltage signal;

(d) applying said second comparison voltage signal to a second input of said operational amplifier;

(e) using the output of said operational amplifier to control the voltage of a pass element control node;

(f) attaching said pass element control node to the control side of at least one pass element disposed in a conduction path between a high voltage source and said trainline;

(g) placing a current-sensing resistor in said conduction path;

(h) sampling the two voltages at the ends of said current-sensing resistor and applying these as inputs to an integrated circuit;

(i) in said integrated circuit, comparing the difference between the two said voltages with a reference voltage, and, in the event that said voltage difference exceeds said reference voltage, providing a nonzero output voltage signal on an output status connector;

(j) providing a conduction path from said output status connector through the photodiode side of an optical isolator to ground; and (k) providing a conduction path from said pass element control node through the photoconductor side of said optical isolator to ground so that in the event that an excessive current passes through said current-sensing resistor, the pass element control node will be grounded so current to said trainline will be turned off.

12. The method, according to claim 11, further comprising the steps of: starting a timer in the event that the current to said trainline is turned off, waiting a predetermined time, and reapplying voltage to said pass element control node to re-energize said trainline.

13. In a locomotive throttle controller having a central processor which generates an analog signal for control of dynamic braking, an analog output driver which supplies the dynamic brake reference voltage, said analog output driver comprising:

(a) a first means connected for receiving an analog signal from said central processor and for converting said analog signal into an analog voltage signal;

(b) a second means connected to receive said analog voltage signal for using said analog voltage signal to provide a regulated voltage output to a trainline which controls said dynamic braking;

(c) a third means connected to said analog output driver for protecting said driver from reverse voltages on said trainline; and (d) a fourth means connected to said analog output driver for protecting said driver from excess current demand of said trainline.

14. The analog output driver, according to claim 13, wherein said first means further comprises means for removing high-voltage spikes from said analog voltage signal.

15. The analog output driver, according to claim 14, wherein said means for removing high-voltage spikes from said analog voltage signal is a diode which normally does not conduct, but which conducts when the voltage across it exceeds a known value; said diode being connected between a node to which said analog voltage signal is applied, and to a ground.

16. The analog output driver, according to claim 13, wherein said first means further comprises means for integrating said analog voltage signal in time to reduce transients.

17. The analog output driver, according to claim 16, wherein said means for integrating said analog voltage signal in time is a capacitor connected to a node to which said analog voltage signal is applied, and to a ground.

18. The analog output driver, according to claim 13, wherein said second means is further characterized as comprising an operational amplifier to compare said analog voltage signal with a feedback voltage signal from said trainline.

19. The analog output driver, according to claim 13, wherein said second means is further characterized as comprising:

(a) an operational amplifier with a first voltage input to which said analog voltage signal is applied, and a second voltage input to which a feedback voltage signal from said trainline is applied;

(b) means for using the output of said operational amplifier to control the voltage on a pass element control node;

(c) a conduction path leading to said trainline; and (d) at least one pass element having its input connected to said pass element control node, said pass element admitting current from a high voltage source to said conduction path leading to said trainline.

20. The analog output driver, according to claim 19, wherein said means for using the output of said operational amplifier to control the voltage on a pass element control node is further characterized as comprising an optical isolator connected so that said output of said operational amplifier passes through the photodiode section of said optical isolator and thence to a ground; the photoconductor section of said optical isolator serving to pass current from a high voltage source to said pass element control node.

21. The analog output driver, according to claim 19, further comprising means for clipping high-voltage spikes from said pass element control node.

22. The analog output driver, according to claim 21, wherein said means for clipping high-voltage spikes comprises a diode which normally does not conduct, but conducts when the voltage across it exceeds a known value; said diode being connected to said pass element control node and to a ground.

23. The analog output driver, according to claim 19, further comprising means for reducing transients by integrating in time the voltage on said pass element control node.

24. The analog output driver, according to claim 23, wherein said means for reducing transients is a capacitor connecting said pass element control node to a ground.

25. The analog output driver, according to claim 19, wherein said at least one pass element is one of a field-effect transistor, and a plurality of field-effect transistors connected in parallel.

26. The analog output driver, according to claim 19, further comprising the following:

(a) a current-sensing resistor disposed in said conduction path;

(b) an integrated circuit having two inputs connected to the two ends of said current-sensing resistor, said integrated circuit being characterized as providing an output signal on an output status connector in the event that the voltage drop across said current-sensing resistor exceeds a predetermined value; and (c) an optical isolator having its photodiode section connected to said output status connector and to a ground, the photoconductor section of said optical isolator being connected to said pass element control node and to a ground, so that when the voltage drop across said current-sensing resistor exceeds said predetermined value, a nonzero voltage value for said output signal causes a current to flow through said photodiode section of said optical isolator, so that said pass element driving node is connected to ground, thereby shutting off the current through said at least one pass element, and thus shutting off the current to said trainline.

27. The analog output driver, according to claim 26, wherein said analog output driver includes a capacitor which serves as a timer connected to input terminals of said integrated circuit.

28. The analog output driver, according to claim 26, wherein current is supplied to said trainline through a diode which is characterized as providing protection from very high reverse voltages.

29. In an electronic signal generator which has a central processor unit and an output driver section, which provides robust electrical control signals to an electrical load based on signals from said central processor, the improvement comprising:

(a) a first means connected for receiving an analog signal from said central processor and for converting said analog signal into an analog voltage signal;

(b) a second means connected to receive said analog voltage signal for using said analog voltage signal to provide a regulated voltage output to provide a robust analog voltage output signal;

(c) a third means connected to said analog output driver for protecting said driver from reverse voltages from said electrical load; and (d) a fourth means connected to said analog output driver for protecting said driver from excess current demand of said load.

* * * * *